Oct. 1, 1968 M. J. MENORET ET AL 3,404,383

BISTABLE CRYOSAR MATRIX MEMORIES AND METHOD OF FABRICATING THE SAME

Filed Nov. 20, 1964 2 Sheets-Sheet 1

INVENTORS
MAURICE J. MENORET & JEAN N. BEJAT
BY
Abraham A. Saffitz
ATTORNEY

INVENTORS
MAURICE J. MENORET & JEAN N. BEJAT
BY
Abraham A. Saffitz
ATTORNEY

United States Patent Office 3,404,383

Patented Oct. 1, 1968

3,404,383

BISTABLE CRYOSAR MATRIX MEMORIES AND METHOD OF FABRICATING THE SAME

Maurice J. Menoret, 12 Ave. de Verdun, Chatillon-sous-Bagneux, and Jean N. Bejat, 4 Rue Antoine Petit, Fontenay-aux-Roses, France Filed Nov. 20, 1964, Ser. No. 412,710
Claims priority, application France, Nov. 26, 1963, 955,086
2 Claims. (Cl. 340—173)

ABSTRACT OF THE DISCLOSURE

A matrix switching network of the cryosar type wherein the ohmic line contacts disposed on opposite faces of a wafer of N-tube germanium are two perpendicular sets of parallel gold-clad platinum wires, each set being soldered to a face of said wafer by formation of a gold-germanium eutectic alloy along the whole length of the wires, the wires serving as external connections for the matrix network.

This invention relates to a fabrication process for high-speed temporary memories of the cryogenic type comprising bistable semiconductor elements, of use for electronic computers, and memories produced by such process.

In particular, an article entitled "The Cryosar—A New Low-Temperature Computer Component" published by A. L. McWhorter and R. H. Rediker in the American Journal, "Proceedings of the I.R.E.," volume 47, number 7, July 1959, pages 1207 to 1213, has disclosed the existence of two types of semiconductor elements known as cryosars from abbreviation of the expression "*Cryo*genic *s*witching by *a*valanche and *r*ecombination," these cryosars operating at the temperature of liquid helium under the effect of an electric field. The first such type, being known as the monostable cryosar, is fabricated from uncompensated germanium, whose very high resistivity due to the de-ionisation of the largest number of umpurity atoms at very low temperature drops to a very low value when the applied electric field reaches a critical value at which the residual free charge carriers acquire sufficient energy to ionise the impurities and produce an avalanche phenomenon similar to a disruptive discharge in a gas. The second type is known as the bistable cryosar and is fabricated from compensated germanium which has in addition a negative resistance zone between its high and low impedance states, so that it can be used as a memory element.

These avalanche and switching phenomena being narrowly localized in the semiconductor volume where the electric field is at least equal to the critical field, a large number of independent cryosars can be produced on a single germanium wafer and interconnected in matrix fashion. The distance between adjacent cryosars must be of the order of twice the thickness of the wafer to avoid the avalanche phenomena occurring laterally between them. Such matrices have been made by various processes, more particularly by forming the lines and columns on a compensated or uncompensated p-type germanium wafer by indium metallization and alloying thereof or by vacuum evaporation. These processes enable matrices to be made with a high cryosar density, but they have the disadvantage that after the matrix has been made connections have to be soldered to its lines and columns and this requires complex apparatus and gives soldered connections of only very limited mechanical strength. Moreover, it is well known that the vacuum evaporation process does not give very homogeneous or reproducible results.

The object of the invention is to facilitate and improve the fabrication of homogeneous and reproducible high-density cryosar matrix networks.

One feature of the cryosar matrix networks according to the invention is that it is formed by a germanium wafer bearing a plurality of equidistant parallel metal wires, hereinafter referred to as the line wires, which are soldered over the entire length of the front face of the wafer, and a plurality of equidistant parallel metal wires, hereinafter referred to as the column wires, which are soldered over the entire width of the back surface perpendicularly to the line wires, the said line and column wires being in ohmic contact with the wafer germanium and serving as external connections for the matrix network.

Another feature of the matrix networks according to the invention is that they are formed by a compensated or uncompensated n-type germanium wafer and by gold-clad platinum wires which are soldered to the germanium by the formation of the eutectic gold-germanium alloy at a suitable temperature.

One feature of the fabrication process according to the invention is that the line wires are soldered to one face of the germanium wafer and the column wires are soldered to the opposite face simultaneously by the use of a graphite matrix formed with a central recess for the germanium wafer and grooves to hold each line wire at the level of the front face of the wafer and each column wire at the level of its rear face and said graphite matrix is provided with a cover which enables appropriate pressure to be exerted on the layers of wires disposed on each side of the wafer, during the heating operation required for their soldering.

The invention will be more readily understood from the following description and from a study of the accompanying drawings, wherein:

FIG. 1 diagrammatically illustrates a cryosar matrix network according to the invention;

Figure 1:
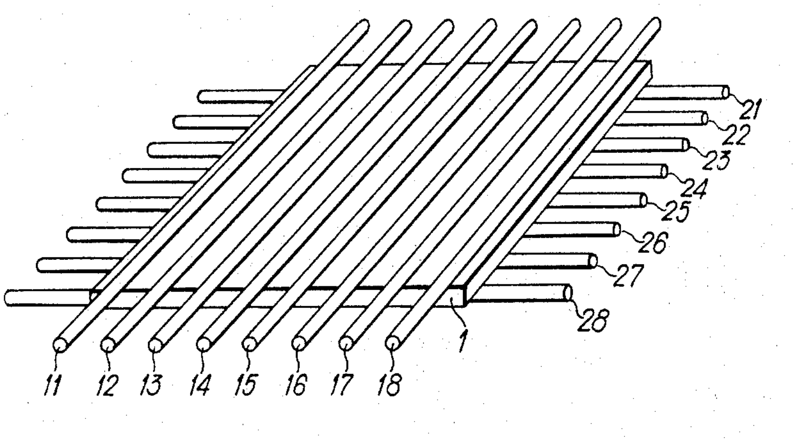

FIG. 1 shows a matrix network comprising sixty-four cryosars, formed by a n-type compensated germanium wafer 1 to the front and back faces of which are respectively soldered eight gold-clad platinum wires 11–18, hereinafter referred to as the line wires, and eight gold-clad platinum wires 21–28 hereinafter referred to as the column wires, which are perpendicular to the line wires. The line wires on the one hand and the column wires on the other hand are parallel and equidistant and are soldered to the germanium wafer over their entire length and width respectively by the fabrication process to be described hereinafter. To give an idea of the sizes, the wafer 1 may be a 5 mm. square wafer, 0.2 mm. thick, the spacing between the parallel wires of each layer thus being 0.4 mm.

A matrix of this kind is fabricated from a wafer cut with a diamond saw from a monocrystalline bar of homogeneous resistivity, doping and compensation produced by the conventional horizontal zone melting process, and then finished by polishing its surfaces with emery. The polishing operation need not be carried too far although good parallelism is required between the two faces of the wafer.

After this mechanical treament, the wafer is etched in a type CP4 solution and then subjected to diffusion of arsenic vapour at 660° C. in a sealed tube in vacuo for 10 to 20 hours to promote the production of good ohmic contacts on its surface, the hourly diffusion depth thus obtained being about 1 micron with a surface concentration of the order of $10^{20}$ atoms per cubic centimeter.

The line and column wires which it is required to solder to the faces of the wafer prepared in this way must have the smallest possible section compatible with adequate mechanical strength for optimum utilization of the wafer surface, which is limited by the dimensions of the germanium monocrystals and helium economy reasons and also a coefficient of expansion as close as possible to that of germanium to avoid any cracks which might arise as a result of internal stresses produced during soldering or subsequently on immersion in liquid helium. The soldering process itself must be suitable for germanium wafers of a thickness of 0.2 mm. which are therefore very fragile and the soldering operation must involve only very small section zones of very limited width and depth. Finally, the parallelism of the wires must be maintained over the entire surface of the wafer, i.e., over a length which may be as much as 20 millimeters in the case of a matrix made up of 32 lines and 32 columns, i.e., 1024 cross-points.

Because of these conditions, a platinum wire was chosen with a diameter of 100 microns electrolytically covered by a coating of gold 10 microns thick, soldering being obtained by the formation of a eutectic gold-germanium alloy of good mechanical strength, for which the platinum wire (which in no way participates in the soldering) provides a solid core. The use of a homogeneous gold wire was dismissed, because the very rapid and difficultly controllable formation of the gold-germanium eutectic may break the wire at the edges of the germanium wafer and if the temperature is reduced to obviate this danger local soldering faults may occur.

Figure 2:
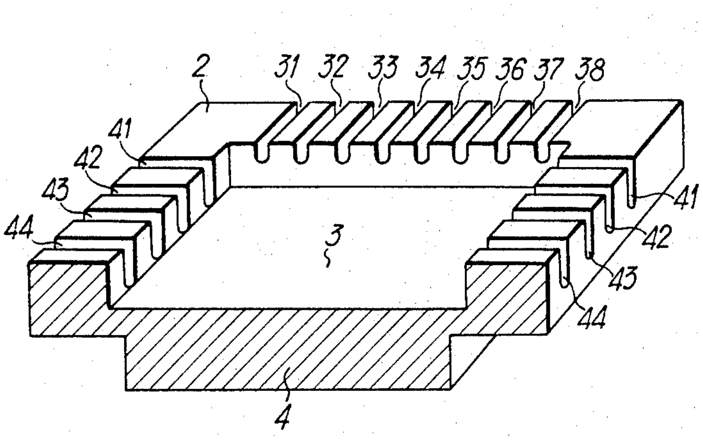
FIG. 2 is a partial perspective view of the graphite matrix used for the fabrication of the matrix network according to FIG. 1.

The device used to hold the gold-clad platinum wires against the opposite surfaces of the germanium wafer during the soldering operation is shown in FIG. 2 in section through one of its planes of symmetry. It comprises a jig of graphite 2 the central part of which has a parallelepipedic cavity 3, which rim is formed with transverse notches respectively, eight notches parallel to one side of the cavity such as 41 to 44 being intended to receive the column wires 21 to 28 of the matrix and extending as far as the bottom of the cavity 3 while eight notches parallel to the other side of the cavity 31 to 38 and intended to receive the line wires 11 to 18 of the matrix extend to a lesser depth so that their bases are flush with the front face of the germanium wafer 1 placed in the cavity 3 on the column wires 21 to 28. The graphite jig 2 is reinforced at the bottom by a projection 4 which is used to hold it on an appropriate support.

Figure 3:
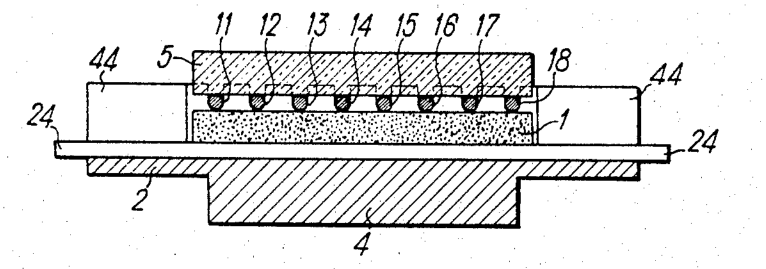
FIG. 3 is a section showing the matrix network according to FIG. 1 during the fabrication in the matrix according to FIG. 2.

FIG. 3 is a section showing the arrangement of the line and column wires on the germanium wafer 1 for their soldering inside the graphite jig 2. The section is through a vertical plane through the notch 44, at the base of which the column wire 24 is visible. The column wires 21 to 28 are first each placed at the bottom of the corresponding notch and then the wafer 1 is placed on the resultant layer of parallel wires. The line wires 11 to 18 are then placed in their respective notches 31 to 38 and thus form a second layer of parallel wires resting on the wafer 1. A sheet of transparent quartz 5 of a size adapted to the opening of the cavity 3 is then placed on the second layer of wires and is subject to the action of a set of springs (not shown) to provide appropriate clamping of the two layers of wires on the wafer 1.

The assembly shown in FIG. 3 is placed in a metal chamber with a lid containing a transparent quartz inspection window so that the formation of the soldered connections between the top wires and the germanium wafer can be observed, and is heated electrically in a dry hydrogen atmosphere by means of a molybdenum band (not shown) surrounding the gaphite block 2. Although the gold-germanium eutectic forms at 360° C., the soldering temperature is set at 50° C. to ensure appropriate wetting over the entire length of the wires, the risk of any excessive dissolution of the germanium being eliminated because of the limited amount of gold covering the platinum wires. The operation can be observed directly with a magnifying glass so that a skilled operator can judge the optimum time required for good soldered connections to be obtained.

After this operation, the resultant matrix is immersed in a CP4 chemical solution for the time required to eliminate the diffusion doped layer between the wires. This time, which depends upon the ageing of the solution used, may for example be 30 seconds in the case of a CP4 solution a few days old, to eliminate a surface layer 20 microns thick. The matrix is then rinsed and dried and its line and column wires are soldered to leads for connection to a distributor intended to be disposed in known manner on the lid of a liquid helium cryostat.

Figure 4:
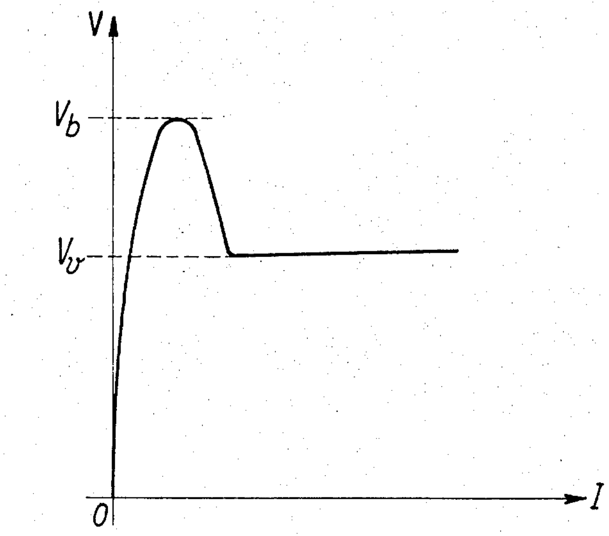
FIG. 4 shows the current-voltage curve of a bistable cryosar.

FIG. 4 shows the current-voltage curve of a bistable cryosar the wafer of which is of n-type compensated germanium. The outstanding points of this curve are its maximum at the switching voltage $V_b$ and its minimum at the trough voltage $V_v$ required to sustain its very low impedance state after switching.

The performances of cryosars formed by the cross-points of a matrix fabricated according to the above desription from a germanium wafer 0.2 mm. thick containing $10^{15}$ atoms of antimony and $0.7\times10^{15}$ atoms of indium per cubic centimeter, corresponding to a n-type germanium of 5 to 6 ohms centimeters resistivity at normal temperature, are as follows:

| | | |
|---|---|---|
| Switching voltage $V_b$ | volts | 1.5 to 2 |
| Sustaining voltage $V_v$ | volts | 1 |
| Differential impedance: | | |
| Before switching | megohms | above 1 |
| After switching | ohms | ≅30 |
| Switching pulse rise time | nanoseconds | ≅30 |
| Switching pulse fall time | nanoseconds | ≅40 |

These pulse times apply up to a recurrence frequency of 4 megacycles per second.

What we claim is:

1. Cryosar matrix network comprising a n-type germanium wafer having a front face and a back face, a plurality of equidistant parallel electrolytically gold-clad platinum line wires soldered over the entire length of the front face of said wafer and a plurality of equidistant parallel electrolytically gold-clad platinum column wires soldered over the entire width of the back face of said wafer perpendicularly to the said line wires, said line and column wires being soldered to said wafer along their whole length under conditions which involve small section zones of limited width and depth and by formation of a gold-germanium eutectic alloy serving as a solid mechanically strong core for said wires at the same time providing ohmic contacts so that their intersection joints form independent cryosars, and said line and column wires projecting from the wafer for connections outside said matrix network.

2. A process for manufacturing cryosar matrix networks comprising the steps of cutting a n-type germanium wafer with parallel faces, electrolytically plating platinum wires with a gold-cladding about said wires, forming a graphite jig having a central recess to receive said wafer, a first plurality of notches for holding a first plurality of parallel gold-clad platinum wires at the level of the bottom of said recess, a second plurality of notches for holding a second plurality of parallel gold-clad platinum wires perpendicularly to the wires of said first plurality of wires at a given distance from the bottom of said recess, and a cover which presses on said second plurality of wires, inserting said first plurality of wires into said first plurality of notches, placing said wafer on said first plurality of wires into said recess, inserting said second plurality of wires into said second plurality of notches, said given distance being such that said second plurality of wires is in contact with said wafer over its entire width, placing said cover on said second plurality of wires, pressing on said cover and simultaneously heating said jig at substantially 500° C. for soldering said wires to said wafer under conditions which involve small section zones of limited width and depth to form in said zone thereby a gold-germanium eutectic alloy serving as a solid mechanically strong core for said wires, etching the matrix network so constituted and soldering connection wires to the parts of said wires projecting from said wafer.

References Cited

UNITED STATES PATENTS

| | | | |
|---|---|---|---|
| 2,801,375 | 7/1957 | Losco | 317—234 |
| 2,854,612 | 9/1958 | Zaratkiewicz | 317—234 |
| 2,992,471 | 7/1961 | Riesz | 317—234 |
| 3,118,130 | 1/1964 | Rediker et al. | 307—88.5 |
| 3,242,391 | 3/1966 | Gorman | 317—234 |
| 3,077,578 | 2/1963 | Kingston et al. | 307—88.5 |

OTHER REFERENCES

A. L. McWhorter and R. H. Rediker: "The Cryosar—A New Low Temperature Computer Component," Lincoln Laboratory, Massachusetts Institute of Technology, Lexington, Mass., Research Report under Contract No. AF 19(122)-458, pp. 1-13 and Fig. 5, Mar. 3, 1959.

BERNARD KONICK, *Primary Examiner.*

J. F. BREIMAYER, *Assistant Examiner.*